United States Patent [19]

Banerjee et al.

[11] Patent Number: 5,432,366
[45] Date of Patent: Jul. 11, 1995

[54] P-I-N MOSFET FOR ULSI APPLICATIONS

[75] Inventors: Sanjay K. Banerjee, Austin, Tex.; Suryanarayana Bhattacharya, Irvine, Calif.; William T. Lynch, Apex, N.C.

[73] Assignee: Board of Regents of the University of Texas System, Austin, Tex.

[21] Appl. No.: 70,715

[22] Filed: May 28, 1993

[51] Int. Cl.[6] .................... H01L 29/10; H01L 29/78
[52] U.S. Cl. ................................. 257/327; 257/345; 257/404; 257/626
[58] Field of Search .............. 257/345, 344, 327, 258, 257/656, 401, 402, 403, 404, 626

[56] References Cited

U.S. PATENT DOCUMENTS

| | | | |
|---|---|---|---|
| 3,617,398 | 11/1971 | Bilous | 257/656 |
| 4,242,691 | 12/1980 | Kotani et al. | 257/327 |
| 4,733,286 | 3/1988 | Matsumoto | 257/258 |
| 5,177,570 | 1/1993 | Tanaka | 257/345 |

FOREIGN PATENT DOCUMENTS 0252666 11/1986 Japan .................. 257/404

Primary Examiner—Rolf Hille
Assistant Examiner—Valencia Martin Wallace
Attorney, Agent, or Firm—Townsend and Townsend Khourie and Crew

[57] ABSTRACT

A MOSFET device for ULSI circuits includes a semiconductor body having first and second spaced doped regions of a first conductivity type which function as source and drain regions, a third doped region between the first and second regions of a second conductivity type, and a first intrinsic region between the third doped region and the drain region, a channel of said MOSFET device including the third doped region and said first intrinsic region. Preferably the device further includes a second intrinsic region between the third doped region and the source region, the channel region of the MOSFET device including the third doped region, the first intrinsic region, and the second intrinsic region. The device further includes an insulating layer over the channel region and a gate electrode formed on the insulating layer over the channel region. A source electrode contact, the first doped region, and a drain electrode contact the second doped region. Several processes are described for fabricating the device.

6 Claims, 5 Drawing Sheets

P-I-N MOSFET FOR ULSI APPLICATIONS

The U.S. Government has rights in the claimed invention pursuant to National Science Foundation Contract No. CHE-8920120 with the University of Texas at Austin.

BACKGROUND OF THE INVENTION

This invention relates generally to semiconductor devices and fabrication thereof, and more particularly the invention relates to field effect transistors for ultra large scale integration (ULSI) semiconductor integrated circuits.

ULSI integrated Circuits having submicron channel lengths require scaling down of the geometries of devices, including the channel length of metal oxide semiconductor field effect transistors (MOSFETS or MISFETS), which is the ubiquitous workhorse in ULSI circuits. The driving force behind scaling down channel length has been an increase of packing density of devices on a typical chip which has concomitant advantages of increased functionality as well as higher throughput-yield for the process. However, the reduction of channel lengths has resulted in severe technological problems in terms of device performance and reliability.

The internal electric fields near the drain end of small geometry MOSFETS are very high, resulting in carrier heating effects and hot electron degradation of devices. To reduce the electric fields, conventionally a lightly doped $N^-$ drain (LDD) is used in MOSFETS where the doping level in the $N^+$ drain adjacent to the channel is reduced so that the electric field near the reverse-biased $N^+/P^-$ drain-channel junction can be lowered. However, the LDD approach has severe problems for deep submicron (less than 0.5 μm) channel lengths since there is an unacceptable real estate penalty for the $N^-$ regions. Further, the fields cannot be reduced sufficiently and the trapped hot electrons in the gate oxide can have serious depletion effects in the $N^-$ region. Source/drain junction depths, especially the $N^-$ junction depths, have to be made very shallow to avoid charge sharing effects such as turn-on voltage, $V_T$, lowering with reduction of the channel length, punch-through and drain induced barrier lowering. Additionally, there are source/drain series resistance problems associated with the shallow $N^-$ region, and to a lesser degree with the shallow $N^+$ regions. Also, there can be enhanced leakage in the $N^-$ region due to band-to-band tunneling or gate induced drain leakage (GIDL). Further, there is a $N^-$ source/drain and gate overlap Miller capacitance and a large source/drain junction capacitance because of the high tank doping required for punch-through protection. All of these factors pose severe technological challenges in fabricating the devices, slow down circuit switching speeds, and increase active power dissipation.

The present invention is directed to an improved MOSFET device for ULSI circuits and the manufacture thereof.

SUMMARY OF THE INVENTION

In accordance with the invention, a MOSFET device is provided in which the channel region includes a doped region separated from at least the drain region and preferably from both the source and drain/regions by intrinsic regions. As used herein, "intrinsic" material includes lightly doped, near intrinsic material as well as counter-doped material with approximately equal N-type and P-type dopants.

From P/N junction theory, reducing the $P^-$ doping in the channel is much more effective in reducing peak electric fields at the reverse biased $N^+/P^-$ drain-channel junction than by reducing the heavier $N^+$ doping in the drain as in the LDD devices. The peak electric field reduces much more strongly with the doping on the more lightly doped side (as in the $P^+$ channel) than with the doping on the more heavily doped drain side (as in LDD structures). Therefore, the new structure reduces carrier heating effects more effectively than in LDD devices. The peak electric field reduction in the new device is more pronounced for deeper (e.g., 2000 Å) source/drain junctions than for shallower (e.g., 1000 Å) junctions. Additionally, the peak electric field profile is such that any hot electron injection effects in the gate oxide will not be over the $N^-$ LDD region and hence will have less deleterious effects than in LDD structures.

In fabricating the intrinsic channel regions in the MOSFET devices of the present invention, one can start with a well doping near the surface with a desired level for the channel with a counter doping implant to convert portions of the channel adjacent to the source and drain regions to near intrinsic doping. Alternatively, the doped region in the channel can be formed in intrinsic material with the source and drain regions formed by the out-diffusion of dopants from heavily doped polysilicon or epitaxial silicon-germanium alloys on the surface of the semiconductor substrate and spaced from the doped channel region. In either process, a short channel device or a long channel device can be readily provided with $V_T$ of the device being a function of the magnitude and width of the P-doped region in the middle of the channel and the gain of the device being an inverse function of total channel length.

The invention and objects and features thereof will be more readily apparent from the following detailed description and appended claims when taken with the drawing.

DETAILED DESCRIPTION OF ILLUSTRATIVE EMBODIMENTS

Figure 1A:
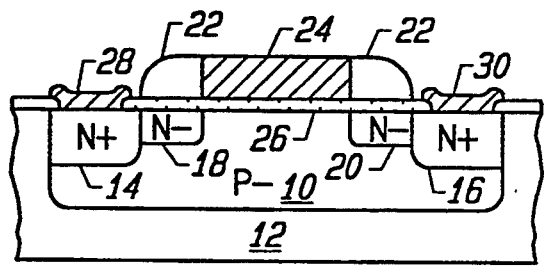
FIGS. 1A, 1B illustrate a cross section view and a doping profile for a conventional short channel LDD MOSFET.
Figure 1B:
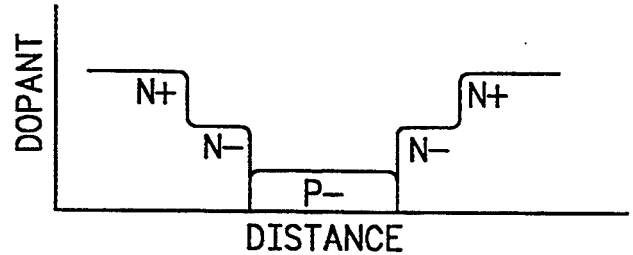

Referring now to the drawings, FIG. 1A is a section view of the conventional LDD MOSFET device and FIG. 1B illustrates relative doping concentration across the length of the device from source to drain. For an N-channel enhancement mode device, a P− well 10 is formed in an intrinsic semiconductor body 12 with N+ source drain regions 14, 16 formed in the well. Lightly doped N− source and drain extensions 18 and 20 are formed under silicon oxide sidewall extensions 22 on either side of the gate electrode 24. An insulating layer such as silicon oxide 26 separates the gate electrode 24 from the underlying channel region between the lightly doped source and drain extensions 18, 20. Ohmic contacts 28 and 30 are provided to the source 14 and drain 16.

Figure 2A:
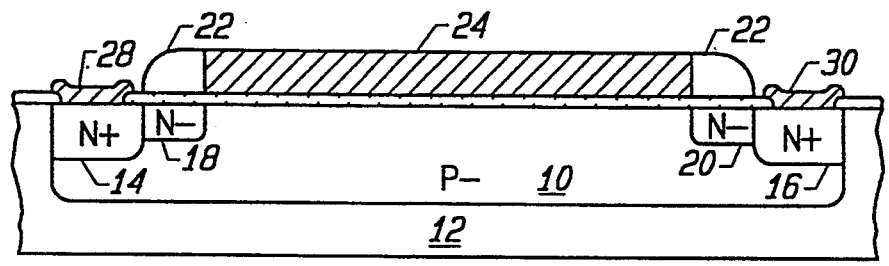
FIGS. 2A, 2B illustrate a cross section view and a doping profile for a long channel conventional LDD MOSFET.
Figure 2B:
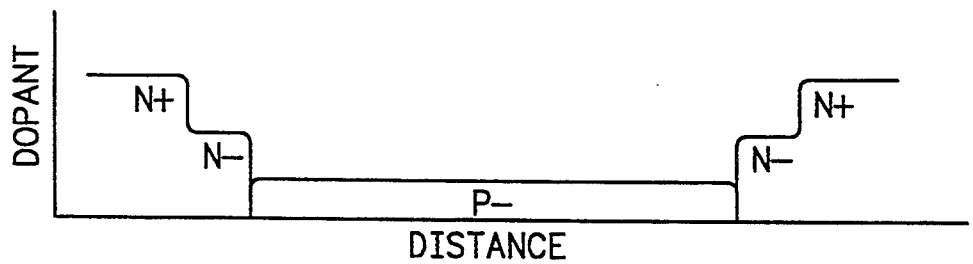

FIG. 2A is a section view of a conventional LDD MOSFET device similar to the device of FIG. 1A except that the channel region is increased in length. Like elements in FIGS. 1A and 2A have the same reference numerals. FIG. 2B illustrates relative doping concentration.

Figure 3A:
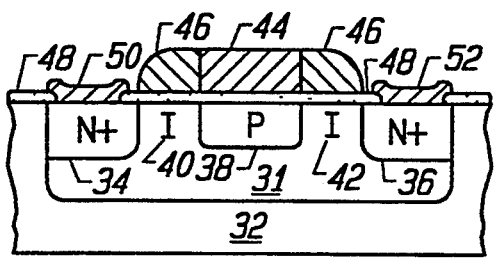
FIGS. 3A, 3B illustrate a cross section view and a doping profile for a short channel MOSFET in accordance with one embodiment of the invention.

FIG. 3A is a section view of a MOSFET device in accordance with one embodiment of the present invention. In this embodiment a P− well 31 is formed in an intrinsic silicon semiconductor body 32 with an N+ source 34 and an N+ drain 36 formed in the P− well 31, However, the channel region is characterized by a P-doped region 38 separated from the source and drain regions by counter doped intrinsic regions 40 and 42. The localized P-doping region 38 has a doping level approximately 2-5 times higher than the P− channel of the LDD device of FIGS. 1A, 2A. The gate electrode for the device comprises a doped polysilicon electrode 44 with sidewall polysilicon 46 on either side of the electrode 44.

Figure 3B:
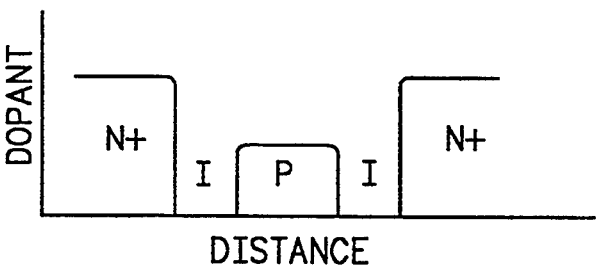

In fabricating the device of FIG. 3A, the well region 31 is doped with the desired P-doping level. The polysilicon electrode 44 is formed over the gate oxide 48 and is smaller than the minimum desired channel length (typically 150 nm polysilicon gate for a 0.25 μm channel length) by overexposure of photoresist or over-etching the polysilicon electrode 44. The gate electrode is used as an implant mask to block a counter doping N implant. The unmasked channel region is converted to near-intrinsic doping, as shown in FIG. 3B. This is followed by a second polysilicon deposition which is reactively ion etched (RIE) to leave the polysilicon sidewall spacers 46 (typically 5-100 nm for 0.25 μm channel lengths). The sidewall polysilicon spacers determine the width of the intrinsic regions and are then used for a self-aligned N+ source/drain implant without any N− LDD regions. The polysilicon sidewall spacers (unlike the sidewall oxide spacers in a conventional LDD MOSFET) are actually extensions of the gate.

Figure 4A:
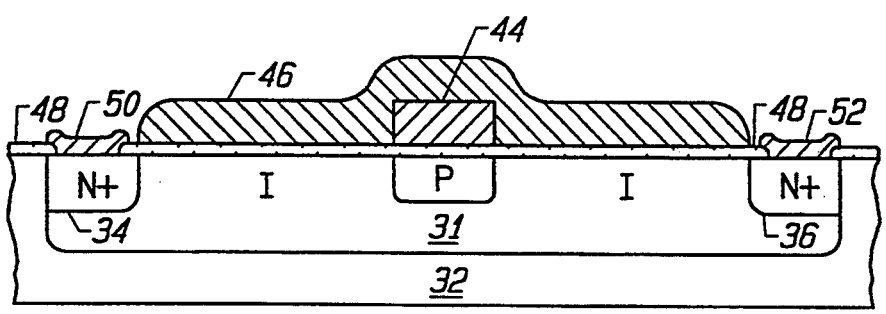
FIGS. 4A, 4B illustrate a cross section and doping profile for a long channel MOSFET in accordance with another embodiment of the invention.
Figure 4B:
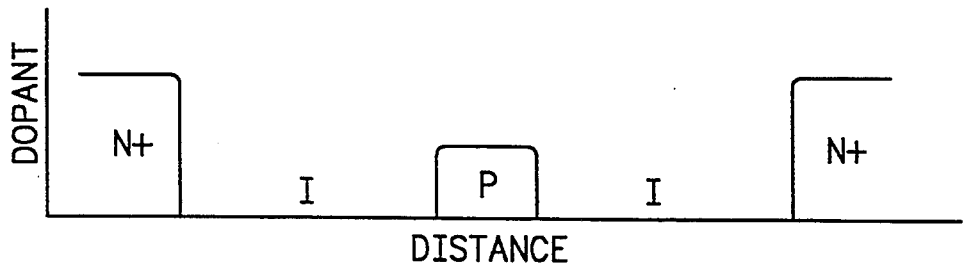

FIG. 4A is a section view of a similar MOSFET device in accordance with the invention but with a longer channel. Again, like elements in FIGS. 3A and 4A have the same reference numerals. To achieve the longer channel length, an additional mask level is used to pattern the second polysilicon layer 46. While an additional masking step is required, alignment of this mask level which determines the location of the P region in the channel region relative to the source/drain regions, is not critical. The $V_T$ of the MOSFET device is relatively insensitive to the location of the P-region in the channel unless the P-region is very close to either of the source/drain regions where there can be charge sharing effects. FIG. 4B illustrates relative doping concentration.

Figure 5A:
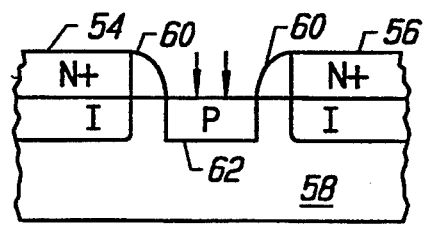
FIGS. 5A, 5B are cross sections illustrating a short channel MOSFET in accordance with another embodiment of the invention.
Figure 5B:
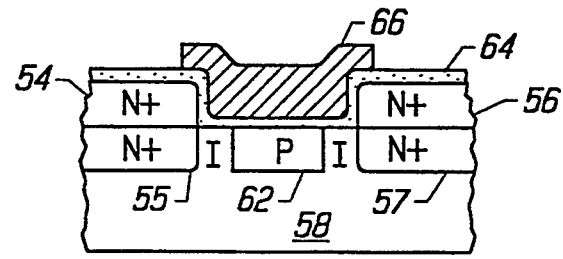
Figure 5C:
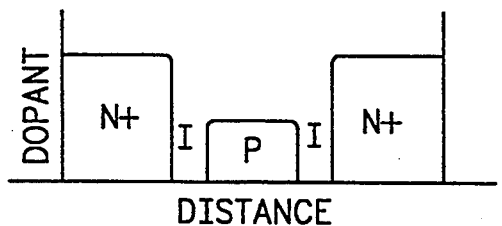
FIG. 5C illustrates doping profile of the device of FIGS. 5A, 5B.
Figure 6A:
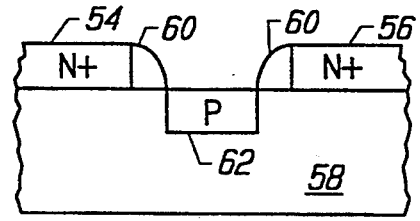
FIGS. 6A, 6B illustrate cross sections of a long channel MOSFET in accordance with another embodiment of the invention.
Figure 6B:
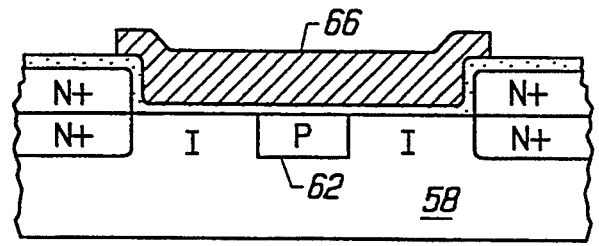
Figure 6C:
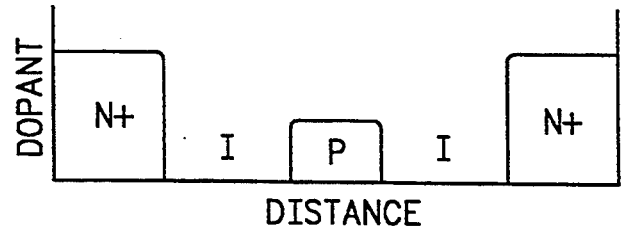
FIG. 6C illustrates doping profile of the device of FIGS. 6A, 6B.

FIGS. 5 and 6 illustrate alternative fabrication techniques in fabricating a MOSFET device in accordance with the invention. As shown in FIG. 5A heavily doped polycrystalline or epitaxial silicon-germanium alloys 54, 56 are formed on the surface of an intrinsic silicon substrate 58. For high germanium mole fractions one can use wet chemical etches that are highly selective with respect to the underlying silicon substrate. A minimum geometry window is etched in the Si—Ge layer, and then the Window is partially closed using chemically vapor-deposited oxides and reactive ion etching to leave sidewall oxide spacers 60 within the window. A heavy P-type implant is then made in the middle of the channel to form the P-region 62. For minimum geometry devices, the sidewall oxide is etched off, a gate oxide is grown, and the polysilicon gate 66 is then deposited on the oxide 64, as shown in FIG. 5B. Dopants from the Si—Ge layers are then driven into the substrate to form the source and drain regions 55 and 57. FIG. 5C illustrates relative dopant concentration.

FIGS. 6A and 6B illustrate a similar fabrication technique for a longer channel length MOSFET device. Again, like elements in FIGS. 5A, 5B, 6A, 6B have the same reference numerals. To provide a longer channel length, after the sidewall oxide is etched off, a second mask is used to etch off more of the Si—Ge layer prior to driving dopants into the source and drain regions 50, 57, then the gate oxide is grown and the polysilicon gate is deposited and patterned as shown in FIG. 6B. Again, alignment accuracy in etching the Si—Ge layer is not critical so long as the P-doped region 62 is not close to either the source or drain. A primary advantage of the method illustrated in FIGS. 5 and 6 over that in FIGS. 3 and 4 is the ease in obtaining the intrinsic regions in the channel region. The obvious disadvantage includes a more complicated fabrication process and a higher gate to source/drain capacitance.

Figure 7A:
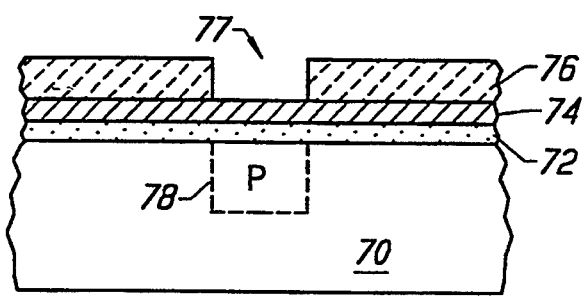
FIGS. 7A–7E are cross-sectional views illustrating process steps in fabricating MOSFET device in accordance with other embodiments of the invention.
Figure 7B:
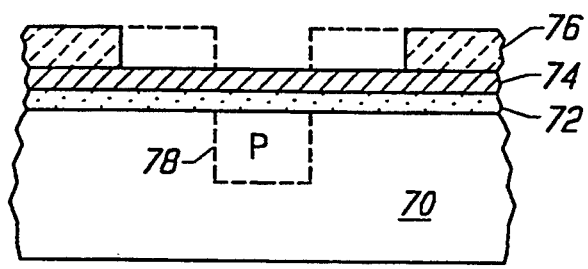

FIGS. 7A-7E are cross-sectional views illustrating process steps in fabricating an "inverse T" embodiment of the invention. As shown in FIG. 7A, a semiconductor body has a gate oxide layer 72 grown on one surface with a thin amorphous silicon layer 74 deposited to protect the oxide layer 72. A low temperature deposited silicon oxide (LTO) layer 76 is then deposited and patterned and RIE etched to form a window 77 for the localized P-doped $V_T$ implant 78. The silicon layer 74 acts as an etch stop. For a longer channel length MOSFET, a second mask is employed to increase the channel length as shown in FIG. 7B.

Figure 7C:
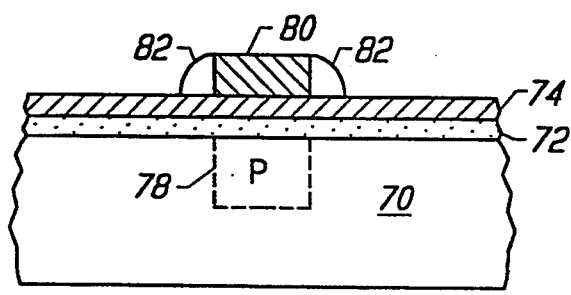
Figure 7D:
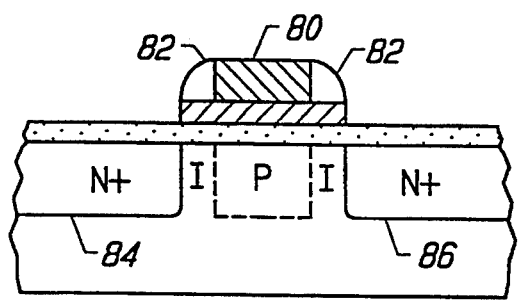

Thereafter, amorphous or polycrystalline silicon gate material is deposited by low pressure chemical vapor deposition (LPCVD) either selectively in the oxide window in layer 76 or non-selectively followed by chemical mechanical polishing to remove the polysilicon from the surface of layer 76. The oxide layer 76 is then removed by wet etching, and silicon oxide sidewall spacers 82 are formed on the polysilicon gate 80 by oxide deposition and reactive ion etching (RIE), as shown in FIG. 7C. The spacers 82 are then used for implanting the self-aligned source 84 and drain 86, as shown in FIG. 7D.

Figure 7E:
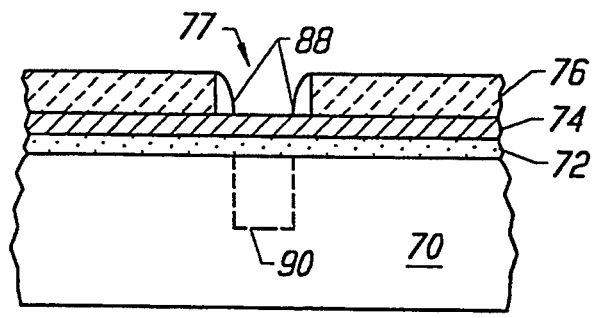

A limitation of the method shown in FIGS. 7A-7D is that the limit to channel length is the minimum lithographic limit plus two sidewall thicknesses. This can be overcome as shown in FIG. 7E by depositing LTO silicon oxide in the window 77 followed by RIE to leave sidewall oxide filaments 88 which partially close window 77 below the minimum lithographic limit prior to the localized P-doped $V_T$ implant 90.

If the user can withstand a slightly higher $V_T$ for the longer channel length MOSFET device, the second mask level in the fabrication schemes can be eliminated. The same approach can be used for short and long channel devices such that a wider P-type doping profile will result for the longer channel length MOSFETS, and all devices will have the same size of intrinsic regions.

Figure 8A:
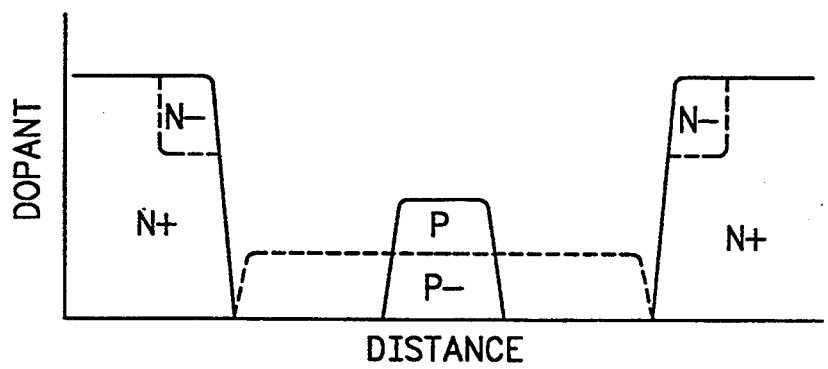
FIGS. 8A, 8B, 8C illustrate a comparison of doping profiles in a conventional MOSFET (dashed) and in a MOSFET in accordance with the invention (solid) with corresponding energy band diagrams.
Figure 8B:
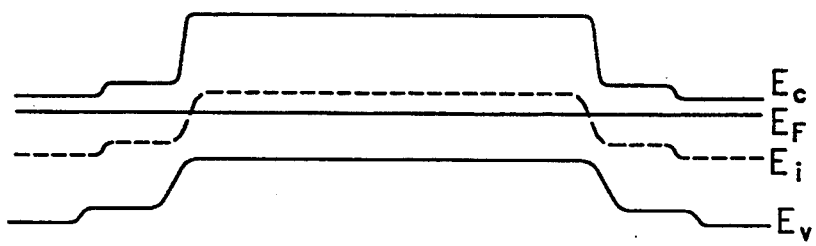
Figure 8C:
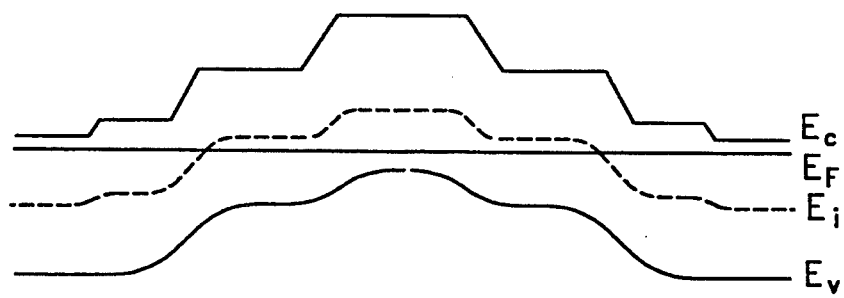

Computer simulations confirm that the MOS device structure in accordance with the invention is better than the LDD devices in terms of punch-through protection and charge sharing. Although the equal potential contours penetrate more readily into the channel region in the new structure, there is much less channel charge to be shared in the vicinity of the source/drain regions. Further, in terms of punch-through and drain-induced barrier lowering, the new structure is preferable to having a uniformly doped channel. This can be appreciated by examining the band diagrams showing the potential barrier in the channel of the new structure compared to the uniformly doped channel of an LDD or non-LDD MOSFET, as illustrated in FIGS. 8A-8C. FIG. 8A illustrates the doping profile for the new device (solid line) and for the LDD device (dotted line). To achieve the same $V_T$ in the new device, a more localized and physically remote and more highly doped channel region creates a higher potential barrier but further away from the source/drain regions than for a uniformly doped channel. Hence, the high electric field profile and voltage drop in the channel near the drain is in the region with low, near-intrinsic doping. Charge sharing effects such as $V_T$ lowering with channel length reduction are less in the new non-uniformly doped channel MOSFET than in the conventional uniformly doped channel MOSFET.

The presence of the intrinsic regions in the channel of the new MOSFET structure has additional advantages. The transverse electric field in the channel near the pinch-off region is reduced. Hence, channel mobility reduction due to surface scattering is less pronounced than in conventional MOSFET devices. Thus drain currents in the saturation region are likely to be higher.

The area penalty associated with the N⁻ regions in the LDD structures is obviated since the intrinsic regions of the new structure are part of the transistor channel itself. A minimal overlap between the gate and the N⁺ source/drains is required. Hence, Miller capacitance is less than in conventional LDD devices. Since the well doping and the channel doping in the vicinity of the source/drain regions can be near intrinsic (punch-through protection is provided by the physically remote higher doped P-region) source/drain junction capacitances are lower leading to faster switching speeds and lower active power dissipation. The source/drain junctions can be deeper than in conventional MOSFET structures without having punch-through or DIBL problems. Hence, source/drain ultra-shallow junctions with attendant fabrication problems such as junction spiking and leakage, and high series resistance of the LDD region can be greatly alleviated. Additionally, since there is no gate overlapping an N⁻ LDD region, there is less problem with GIDL. The $V_T$ roll-off with channel length in the new structure is less than in the conventional MOSFET device.

There has been described a new and improved MOSFET device especially useful in ULSI semiconductor circuits, and methods of fabricating same. While the invention has been described with reference to specific embodiments, the description is illustrative of the invention and is not to be construed as limiting the invention. For example, while the described devices are N-channel enhancement mode transistors, the invention can be implemented in P-channel devices. As noted above while intrinsic regions adjacent to both the source and drain regions are preferred, an intrinsic region adjacent only to the drain region can be employed. As noted, the "intrinsic" region can be lightly doped (nearly intrinsic) as well as counter-doped material with approximately equal N-type and P-type dopants. Thus, various applications and modifications may occur to those skilled in the art without departing from the true spirit and scope of the invention as defined by the appended claims. Note also that the intrinsic region can be provided only between the doped channel region and the drain region.

What is claimed is:

1. A MOSFET device comprising
   a semiconductor body having first and second spaced doped regions of a first conductivity type which function as source and drain regions,
   a third doped region between said first and second regions of a second conductivity type,
   a first intrinsic region between said third doped region and said drain region, a channel of said MOSFET device including said third doped region and said first intrinsic region,
   an insulating layer over said channel region, and
   a gate electrode formed on said insulating layer over said channel region including over said first intrinsic region.

2. The MOSFET device as defined by claim 1 and further including a second intrinsic region between said third doped region and said source region, said channel region of said MOSFET device including said third doped region, said first intrinsic region, and said second intrinsic region.

3. The MOSFET device as defined by claim 2 and further including a source electrode contacting said first doped region and a drain electrode contacting said second doped region.

4. The MOSFET device as defined by claim 3 wherein said first conductivity type is N-type and said conductivity type is P-type.

5. The MOSFET device as defined by claim 4 wherein said semiconductor body comprises an intrinsic silicon substrate.

6. The MOSFET device as defined by claim 5 wherein said first intrinsic region and said second intrinsic region comprise portions of a doped well in said substrate, said intrinsic regions being formed by counter-doping.

* * * * *